United States Patent
Sun et al.

[11] Patent Number: 5,920,065
[45] Date of Patent: Jul. 6, 1999

[54] OPTICALLY ACTIVATED BACK-TO-BACK PIN DIODE SWITCH HAVING EXPOSED INTRINSIC REGION

[75] Inventors: Chen-Kuo Sun; Ching T. Chang; Donald J. Albares; Richard Nguyen, all of San Diego, Calif.

[73] Assignee: The United States of America as represented by the Secretary of the Navy, Washington, D.C.

[21] Appl. No.: 08/970,328

[22] Filed: Nov. 14, 1997

[51] Int. Cl.⁶ .................................................. H01J 40/14
[52] U.S. Cl. .............................. 250/214.1; 250/214 LS; 257/458
[58] Field of Search ........................... 250/551, 214 R, 250/214.1, 214 LS, 214 A, 208.1; 257/81–84, 431–434, 458; 356/221, 223, 226

[56] References Cited

U.S. PATENT DOCUMENTS

| | | |
|---|---|---|
| 4,123,673 | 10/1978 | Gonser . |
| 4,654,610 | 3/1987 | Dasilva . |
| 4,665,316 | 5/1987 | Hodges . |
| 4,712,020 | 12/1987 | Basile . |
| 4,825,081 | 4/1989 | Wille et al. . |
| 4,883,984 | 11/1989 | Kess . |
| 4,899,204 | 2/1990 | Rosen et al. . |
| 4,980,611 | 12/1990 | Orenstein . |
| 4,985,621 | 1/1991 | Aull et al. .......................... 250/214 LS |
| 5,001,335 | 3/1991 | Takaoka et al. . |
| 5,072,189 | 12/1991 | Openlander . |
| 5,073,974 | 12/1991 | Nishimura . |
| 5,109,205 | 4/1992 | Hart et al. . |
| 5,146,075 | 9/1992 | Kim et al. . |
| 5,214,275 | 5/1993 | Freeman et al. ......................... 250/551 |
| 5,257,411 | 10/1993 | Minasi . |
| 5,581,077 | 12/1996 | Chirovsky et al. ....................... 250/551 |
| 5,630,213 | 5/1997 | Vannatta . |

Primary Examiner—Que T. Le
Attorney, Agent, or Firm—Harvey Fendelman; Michael A. Kagan; Eric James Whitesell

[57] ABSTRACT

The optoelectronic switch of the present invention comprises two PIN diodes connected in series with opposed polarity having their intrinsic regions coupled to a light source for maintaining both diodes in the conductive state while the light source is on and in the non-conductive state while the light source is off.

5 Claims, 2 Drawing Sheets

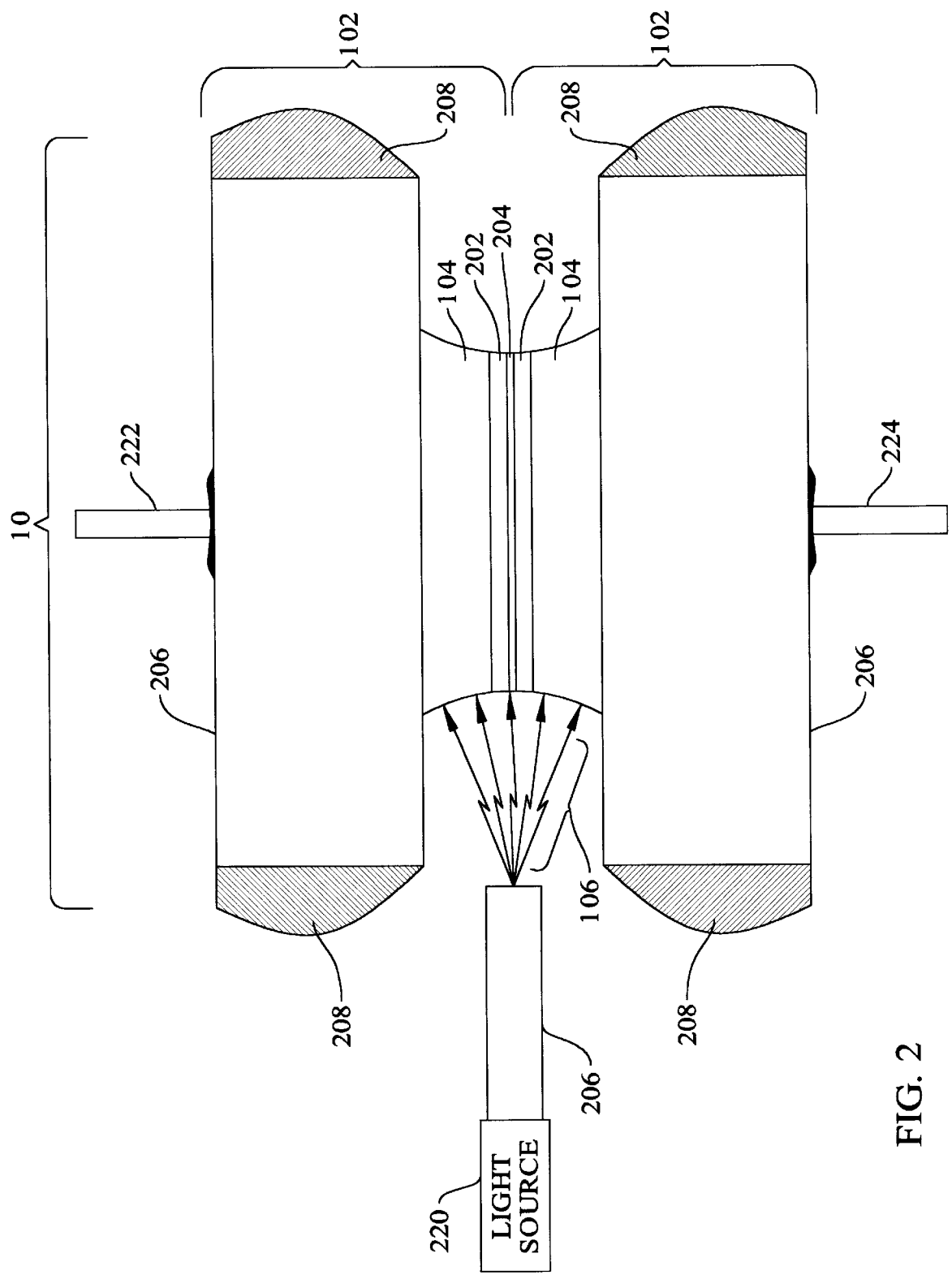

OPTICALLY ACTIVATED BACK-TO-BACK PIN DIODE SWITCH HAVING EXPOSED INTRINSIC REGION

BACKGROUND OF THE INVENTION

The present invention relates to an optically activated switch for high power RF signals. More specifically, but without limitation thereto, the present invention relates to photo-voltaic switches having relatively low optical activation power.

Optically-activated RF switches include photoconductive switches, phototransistors, surface-depleted optical FET's, and photovoltaic field effect transistors. A photoconductive switch typically has an on-resistance that is linearly proportional to the power of the optical control signal, thus a low on-resistance of about 2 ohms typically requires an optical control signal power of over 50 mW. Switching time is generally linearly proportional to the carrier lifetime of the photoconductor and inversely proportional to the on-resistance. A high speed photoconductive switch thus tends to have the disadvantage of a high on-resistance. Phototransistors generally require high optical control power for a low on-resistance, and consequently suffer from the problem of a low off-resistance. The load resistance of a typical RF application, however, such as a dipole antenna, is approximately 73 ohms. An RF switch capable of switching a 100 W signal for such applications should have an off-resistance of at least 10k ohms to adequately isolate the input from the output in the off state and an om-resistance of about 1 ohm.

U.S. Pat. No. 4,825,081 issued on Apr. 25, 1989 to Wille et al discloses series connected PIN diodes with P electrodes connected to N electrodes, i.e. commonly aligned polarity (col. 2, ln. 63–66) as a switching element controlled by a light source, but suffers the disadvantage of requiring a reverse bias voltage source (col. 3, ln. 1–7).

A need therefore exists for an optically activated RF switch having a low on-resistance, a high off-resistance, and low optical control power.

SUMMARY OF THE INVENTION

The optoelectronic switch of the present invention is directed to overcoming the problems described above, and may provide further related advantages. No embodiment of the present invention described herein should be construed to preclude other embodiments or advantages that may exist or become obvious to those skilled in the art.

The optoelectronic switch of the present invention comprises two PIN diodes connected in series with opposed polarity having their intrinsic regions coupled to a light source for maintaining both diodes in the conductive state while the light source is on and in the non-conductive state while the light source is off.

An advantage of the optoelectronic switch of the present invention is that a low on-resistance and high off-resistance may be achieved by optical control power without an electrical control signal.

Another advantage is that the switched signal may be remotely located from the optical control source.

A further advantage is that no reverse bias need be supplied by the control circuit to turn the switch off.

Yet another advantage of the optoelectronic switch is that a signal having a frequency bandwidth of over 1 GHz and a signal power of over 10 W may be switched with relatively low optical control power.

Still another advantage of the optoelectronic switch is that the switched signal may be electrically, magnetically, and thermally isolated from the optical control source.

The features and advantages summarized above in addition to other aspects of the present invention will become more apparent from the description, presented in conjunction with the following drawings.

BRIEF DESCRIPTION OF THE DRAWINGS

FIG. 2 is a structural diagram of the embodiment shown in FIG. 1.

DESCRIPTION OF THE INVENTION

Figure 1:
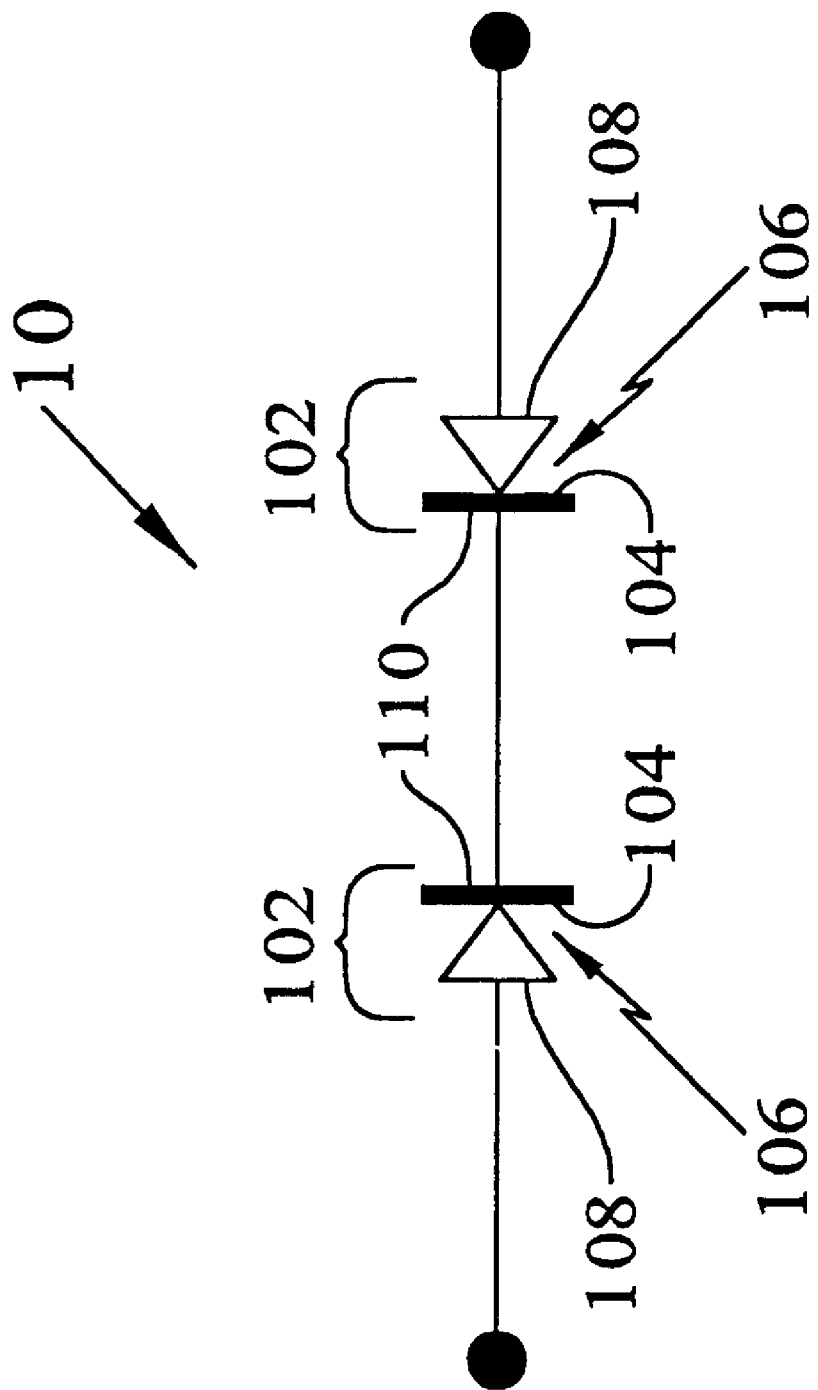
FIG. 1 is a diagram of an optoelectronic switch of the present invention.

The following description is presented solely for the purpose of disclosing how the present invention may be made and used. The scope of the invention is defined by the claims.

FIG. 1 is a circuit diagram of an optoelectronic switch 10 of the present invention comprising two PIN (P-type layer/Intrinsic layer/N-type layer) diodes 102 connected in series with opposed polarity having intrinsic layers 104 exposed for coupling to optical energy 106 between P-type layers 108 and N-type layers 110. Optical energy 106 may be supplied, for example, by a laser. Optoelectronic switch 10 is switched on while optical energy 106 is present and switched off when optical energy 106 is not illuminating intrinsic layers 104. It is believed that optical energy 106 replenishes the carriers in intrinsic layers 104 normally lost in recombination during the carrier lifetime to maintain both PIN diodes 102 in a conductive state.

FIG. 2 is a structural diagram of optoelectronic switch 10 illustrating P-type layers 108, intrinsic layers 104, and N-type layers 110 of PIN diodes 102 shown in FIG. 1 connected electrically by, for example, a layer of solder 204 between P-type layers 108. Alternatively, commericially available PIN diodes may be connected by conductive cement, wire leads, and other well known electrical connecting methods with encapsulating material 208 removed to expose intrinsic layers 104. Intrinsic layers 104 are illuminated to optical energy 106 from light source 220 via optical fiber 206. Alternatively, a transparent window may be formed around intrinsic regions 104 according to well known techniques to couple optical energy 106 directly from light source 220.

In operation an input signal is applied to input 222 of optoelectronic switch 10. A light source 220 supplies optical energy 106 through optical fiber 206 to cause the input signal to propagate through optoelectronic switch 10 with a relatively low insertion loss and low on-resistance. When light source 220 discontinues supplying optical energy 106, the input signal is isolated from output 224 by a relatively high off-resistance typically dominated by the capacitance of PIN diodes 102. The switching speed of optoelectronic switch 10 depends on the PIN diode design parameters, the input signal current, and the power of optical energy 106. Typical switching speeds may range from nano-seconds to milli-seconds. Typical values for insertion loss are less than 1 dB and for the input-to-output isolation at least 20 dB over the frequency range of 10 MHz to 1 Ghz.

The optoelectronic switch of the present invention may be integrated in a package or on a circuit board as a vertical or lateral structure by methods well known in the art. Applications for the optoelectronic switch include switched frequency antennas, switched bandpass filters, and other RF current switching functions.

Other modifications, variations, and applications of the present invention may be made in accordance with the above teachings other than as specifically described to practice the invention within the scope of the following claims.

We claim:

1. An optoelectronic switch for switching an input signal comprising:

at least two PIN diodes connected in series with opposed polarity;

wherein said PIN diodes have an intrinsic region exposed for coupling to a light source to maintain the switch in a substantially conductive state while light is received from the light source and in a substantially non-conductive state while light is not received from the light source.

2. The optoelectronic switch of claim 1 further comprising the light source.

3. The optoelectronic switch of claim 1 further comprising an optical fiber coupling the light source to the intrinsic region.

4. The optoelectronic switch of claim 1 further comprising an input port connected to an N-region of one PIN diode and an output port connected to an N-region of another PIN diode.

5. An optoelectronic switch for switching an input signal comprising:

at least two PIN diodes connected in series with opposed polarity;

wherein said PIN diodes have an intrinsic region exposed for coupling to a light source for switching the PIN diodes between a substantially conductive state and a substantially non-conductive state.

* * * * *